United States Patent
Premerlani

(10) Patent No.: US 6,915,219 B2
(45) Date of Patent: Jul. 5, 2005

(54) METHOD FOR CANCELING TRANSIENT ERRORS IN UNSYNCHRONIZED DIGITAL CURRENT DIFFERENTIAL TRANSMISSION LINE PROTECTION SYSTEMS

(75) Inventor: William J. Premerlani, Scotia, NY (US)

(73) Assignee: General Electric Company, Schenectady, NY (US)

( * ) Notice: Subject to any disclaimer, the term of this patent is extended or adjusted under 35 U.S.C. 154(b) by 125 days.

(21) Appl. No.: 10/652,151

(22) Filed: Aug. 29, 2003

(65) Prior Publication Data

US 2005/0049806 A1 Mar. 3, 2005

(51) Int. Cl.[7] .......................... G06F 19/00; G01R 31/00
(52) U.S. Cl. ....................................................... 702/58
(58) Field of Search ................................ 702/57–59, 64, 702/85, 89, 106; 361/1; 363/50; 700/292; 714/799

(56) References Cited

U.S. PATENT DOCUMENTS

| | | | |
|---|---|---|---|
| 5,428,549 A | * | 6/1995 | Chen ............................ 702/59 |
| 5,798,932 A | * | 8/1998 | Premerlani et al. ........... 702/59 |
| 5,809,045 A | | 9/1998 | Adamiak et al. |
| 6,141,196 A | * | 10/2000 | Premerlani et al. ........... 361/78 |
| 6,311,307 B1 | * | 10/2001 | Adamiak et al. ........... 714/799 |
| 6,456,947 B1 | * | 9/2002 | Adamiak et al. ............. 702/59 |

OTHER PUBLICATIONS

Line Current Differential, Distance, Out-of-Step, Overcurrent, Voltage, Synchronism Check, and Frequency Elements, SEL–311L/SEL–311L–6 Instruction Manual, Section 3, Jul. 3, 2002; p. 3–1–3–91.

* cited by examiner

Primary Examiner—John Barlow
Assistant Examiner—Demetrius Pretlow
(74) Attorney, Agent, or Firm—Cantor Colburn LLP

(57) ABSTRACT

A method for determining transient errors in an unsynchronized, digital current differential transmission line protection system includes receiving a first current phasor measurement at a time, t, and receiving a second current phasor measurement at time t. The second current phasor is adjusted so as to account for a determined offset between a first sampling clock associated with the first current phasor measurement and a second sampling clock associated with the second current phasor measurement, thereby resulting in a rotated second current phasor measurement. A residual transient error is then obtained from the rotated second current phasor measurement and the first current phasor measurement.

11 Claims, 2 Drawing Sheets

METHOD FOR CANCELING TRANSIENT ERRORS IN UNSYNCHRONIZED DIGITAL CURRENT DIFFERENTIAL TRANSMISSION LINE PROTECTION SYSTEMS

BACKGROUND OF THE INVENTION

The present disclosure relates generally to digital current differential transmission systems and, more particularly, to a method for canceling transient errors in unsynchronized digital current differential transmission line protection systems.

In recent years, there has been an increased interest in the application of line differential relays to very long power transmission lines by utilities all over the world. This renewed attention to this technique is due, in large part, to the availability of digital differential relays operating over high-speed digital communication channels. The basic operating principle of current differential relaying is to calculate the difference between the currents entering and leaving a protected zone, such that a protection feature is engaged whenever the current difference exceeds a threshold level. Accordingly, line differential relaying requires that the information of the current flowing through each line terminal is made known to all other terminals.

Earlier line differential relays utilized analog communication channels, typically in the form of pilot wires in order to exchange the current values between terminals. The application of an analog line differential scheme over pilot wires was limited to a maximum distance of about 8–10 kilometers, due to several factors such as pilot wire capacitance resistance, extraneously induced voltages (e.g., ground potential rise), etc. On the other hand, the arrival of digital communications allowed relay manufacturers to encode the information exchanged between the relay terminals as logical zeros and ones. Thus, a preferred choice of communication media for digital differential relays has been a direct fiber optic connection, as it provides security and noise immunity.

One way to realize improved system sensitivity is through the use of synchronized sampling. Because differential current is computed as the total of the phasor currents measured at the same time at all terminals, the system sensitivity is thus ultimately limited by the accuracy of those phasor measurements. Accordingly, in order to eliminate such errors due to time misalignment, each phasor is constructed from a set of instantaneous current samples taken at precisely the same time at all terminals in the system. In a synchronized system (such as, for example, the L90 system offered by General Electric), this is achieved through the use of synchronized sampling clocks. Each terminal has a sampling clock that controls both the precise time when current samples are measured, as well as the assignment of phasor coefficients to each sample. The sampling clocks are synchronized to within a few microseconds of one other through exchanges of time stamps using one or more techniques for clock synchronization so as to prevent differential measurements from being contaminated by time misalignment errors.

However, not every existing current differential protection system implements the use of synchronized sampling. In these instances, as an alternative to completely replacing those systems with synchronized systems, it is still desirable to be able to improve upon the performance of an unsynchronized system.

BRIEF DESCRIPTION OF THE INVENTION

The above discussed and other drawbacks and deficiencies of the prior art are overcome or alleviated by a method for determining transient errors in an unsynchronized, digital current differential transmission line protection system. In an exemplary embodiment, the method includes receiving a first current phasor measurement at a time, t, and receiving a second current phasor measurement at time t. The second current phasor is adjusted so as to account for a determined offset between a first sampling clock associated with the first current phasor measurement and a second sampling clock associated with the second current phasor measurement, thereby resulting in a rotated second current phasor measurement. A residual transient error is then obtained from the rotated second current phasor measurement and the first current phasor measurement.

In another aspect, a method for canceling transient errors in an unsynchronized, digital current differential transmission line protection system. In an exemplary embodiment, the method includes receiving a first current phasor measurement at a time, t, and receiving a second current phasor measurement at time t. The second current phasor is adjusted so as to account for a determined offset between a first sampling clock associated with the first current phasor measurement and a second sampling clock associated with the second current phasor measurement, thereby resulting in a rotated second current phasor measurement. A residual transient error is obtained from the rotated second current phasor measurement and the first current phasor measurement, and the residual transient error is subtracted out from the first and second current phasor measurements.

BRIEF DESCRIPTION OF THE DRAWINGS

Referring to the exemplary drawings wherein like elements are numbered alike in the several Figures.

DETAILED DESCRIPTION OF THE INVENTION

Disclosed herein is a method for canceling transient errors in unsynchronized digital current differential transmission line protection systems. Briefly stated, in those classes of digital current differential transmission line protection systems in which sampling is not synchronized, two error components are calculated in improving the sensitivity in the unsynchronized current sampling. The first error component (as is well known) is a phasor rotation to compensate for a sampling clock shift for a periodic current waveform. However, there is also a second error component that results from a transient effect and can cause misoperation of this type of protection system under certain transient conditions, such as during line energization, for example.

Figure 1:
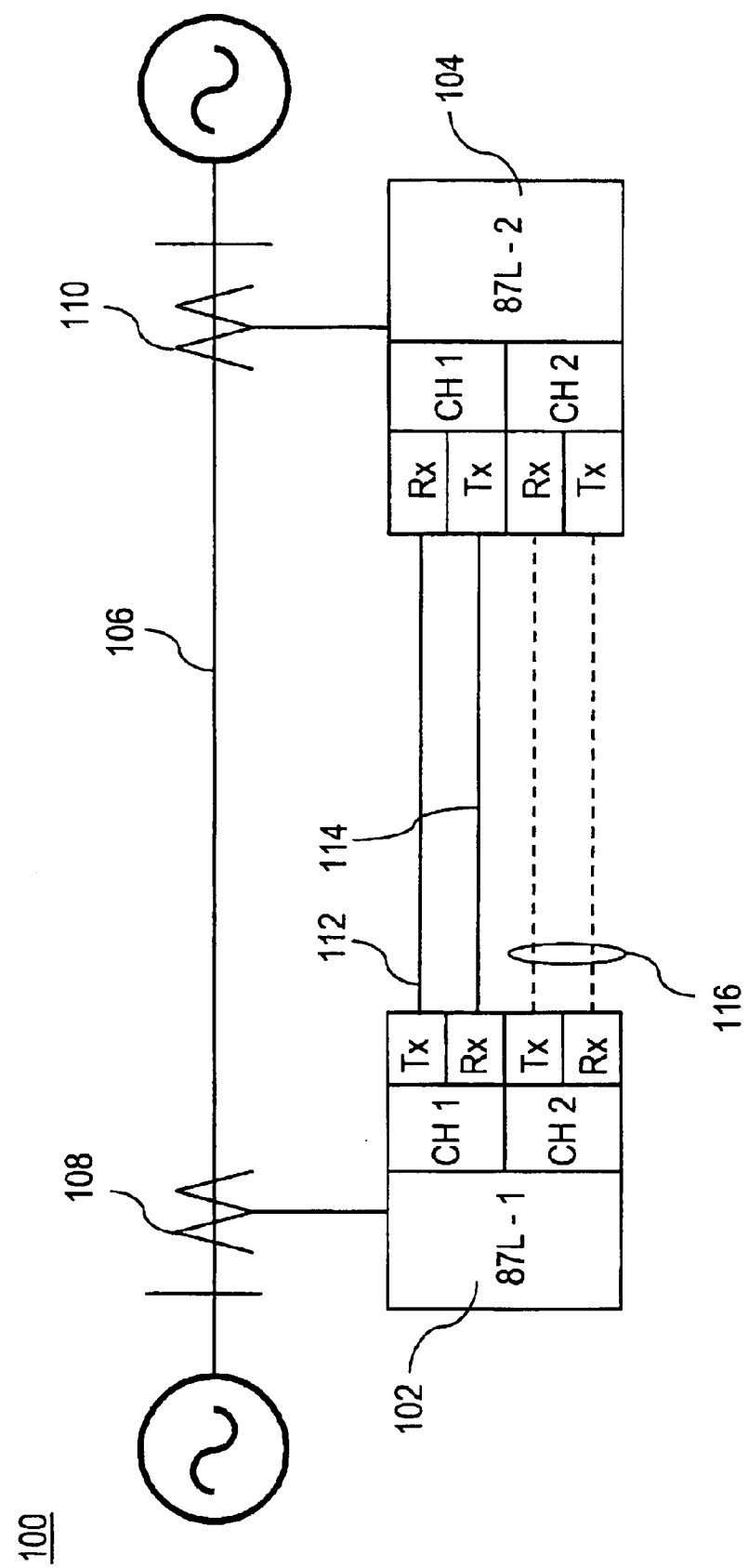
FIG. 1 is a schematic diagram of an exemplary transmission protection, digital current differentiation system suitable for use in accordance with and embodiment of the invention.

Referring initially to FIG. 1, there is shown a schematic diagram of an exemplary transmission protection, digital current differentiation system 100. A pair of current differential relays 102, 104 compare the current entering and leaving the protected circuit (e.g., transmission line 106) through the use of remote current sensing devices 110. A pair of transmitting and receiving communication lines 112, 114, respectively, are used to convey the current information from one relay to another. Optionally, the system 100 may include a redundant communication channel, as indicated by dashed lines 116.

As may often be the case in such a line differential scheme, the entering and leaving currents are relatively far apart from each other. Thus, the current information measured by a relay at one terminal is transmitted to the other terminal in order to make the differential comparison. Moreover, in order to evaluate the differential function, these current samples have to be taken at the same time on both terminals. Ideally, this dictates that the relay clocks be synchronized, since any time difference therebetween will translate into a differential current that could cause a relay to malfunction.

However, as stated previously, in some current differential systems the sampling is not precisely synchronized, or is not synchronized altogether. As a result, there may be unknown offsets in the local sampling clocks or, even if known, the offsets are not used to synchronize the clocks, but only to later adjust current phasor values. In either case, there remains an additional transient error component introduced in a current phasor estimate.

In the exemplary protection system embodiment of FIG. 1, it is initially assumed that the instantaneous current entering one end of the protected transmission line 106 is exactly equal to the instantaneous current leaving the other end. Current phasors at both ends of the transmission line 106 are computed over a one cycle window. For simplification purposes, the phasor computation thereof may be approximated with a Fourier integral. If it is further assumed that the current measurements at the two ends of the transmission line 106 are not synchronized but that the sampling clock offset is known, then the one-cycle phasor value of the current entering the line at terminal 1 is given approximately by the expression:

$$I_1(t) \approx \frac{2}{T} \int_{-T}^{0} i(t+\tau) \cdot e^{-j\frac{2\pi\tau}{T}} \cdot d\tau$$

wherein:

T=time period at the nominal frequency of the power system $I_1(t)$=one cycle phasor value of the current at terminal 1 at time t Correspondingly, the phasor value of the current leaving the line 106 at terminal 2, accounting for the clock offset, is given approximately by:

$$I_2(t) \approx \frac{2}{T} \int_{-T+\Delta t}^{\Delta t} i(t+\tau) \cdot e^{-j\frac{2\pi(\tau-\Delta t)}{T}} \cdot d\tau$$

wherein:

$\Delta t$=time offset of the terminal 2 sampling clock relative to terminal 1

$I_2(t)$=one cycle phasor value of the current at terminal 2 at time t

It can be shown that, for a periodic current waveform, there is a rotation of the current phasor measured at one terminal relative to the other terminal, corresponding to the offset of the sampling clock. In systems in which no attempt is made to synchronize the sampling clocks, the rotation angle could be as large as 180 degrees. In unsynchronized systems, then, it is clear that phasors should be adjusted to account for clock offset. Notwithstanding any phasor adjustment however, there may be an error in the estimate of the clock offset, in which case there will still be a residual error in the relative phase angles of the adjusted phasors. The same is true for synchronized systems; i.e., a residual error in clock synchronization translates into a phase angle error in the phasors.

Therefore, continuing the analysis of an unsynchronized systems, and further assuming that the relative offset between the sampling clocks is measurable, with the second phasor being rotated to account for the offset, then:

$$I_2'(t) = e^{-j\Delta\phi} \cdot I_2(t)$$

$$= \frac{2}{T} \int_{-T+\Delta t}^{\Delta t} i(t+\tau) \cdot e^{-j\frac{2\pi\tau}{T}} \cdot d\tau$$

$$\Delta\phi = \frac{2\pi \cdot \Delta t}{T} = \text{relative clock shift in radians,}$$

at the power system frequency

Although this rotation compensates for a sampling clock shift for a periodic current waveform, there is still an error during transients that has not been compensated heretofore. To obtain an expression for the phasor error remaining after the rotation, the expression for the difference between the rotated phasor from terminal 2 and the phasor from terminal 1 may be expanded as follows:

$E(t)$ = residual error after phasor rotation $$E(t) = I_2'(t) - I_1(t)$$

$$= \frac{2}{T} \int_{-T+\Delta t}^{\Delta t} i(t+\tau) \cdot e^{-j\frac{2\pi\tau}{T}} \cdot d\tau - \frac{2}{T} \int_{-T}^{0} i(t+\tau) \cdot e^{-j\frac{2\pi\tau}{T}} \cdot d\tau$$

It will be noted that most, but not all, of the two integrals cancel, leaving the following simplified expression for the error phasor after rotation:

$$E(t) = \frac{2}{T} \int_{0}^{\Delta t} [i(t+\tau) - i(t+\tau-T)] \cdot e^{-j\frac{2\pi\tau}{T}} \cdot d\tau$$

Moreover, if the time offset becomes relatively small enough, then the above expression may be further simplified as:

$$E(t) = \left[2\frac{\Delta t}{T}\right] \cdot [i(t) - i(t-T)]$$

This expression agrees with physical intuition; that is, when the sampling clocks are not synchronized, there is a relative shift of the windows over which phasors are being computed. The residual error, after a phasor rotation, is the phasor value of the difference between the two non-overlapping portions of the windows. From either perspective, several conclusions may be drawn. First, the error due to a sampling clock shift goes to zero as the shift itself goes to zero, as would expected. Second, a phasor rotation exactly corrects for a sampling clock shift when the current in the protected line is exactly periodic. However, such a phasor rotation does not correct for a sampling clock shift during transients. In that case, there can be a significant error, as given by the above equations. For small clock shifts, this error lies mainly in the real component of the current phasor. As such, the error can be in any direction with respect to the current phasors.

Consequently, for unsynchronized systems, the error phasor can be quite large during transients, depending on the amount of clock shift and the details of the transient. For example, with a clock shift of 90 degrees, line energization can produce an error on the order of 100%. With respect to synchronized systems, the sensitivity thereof during transients (such as line energization) will be limited by residual synchronization error.

Figure 2:
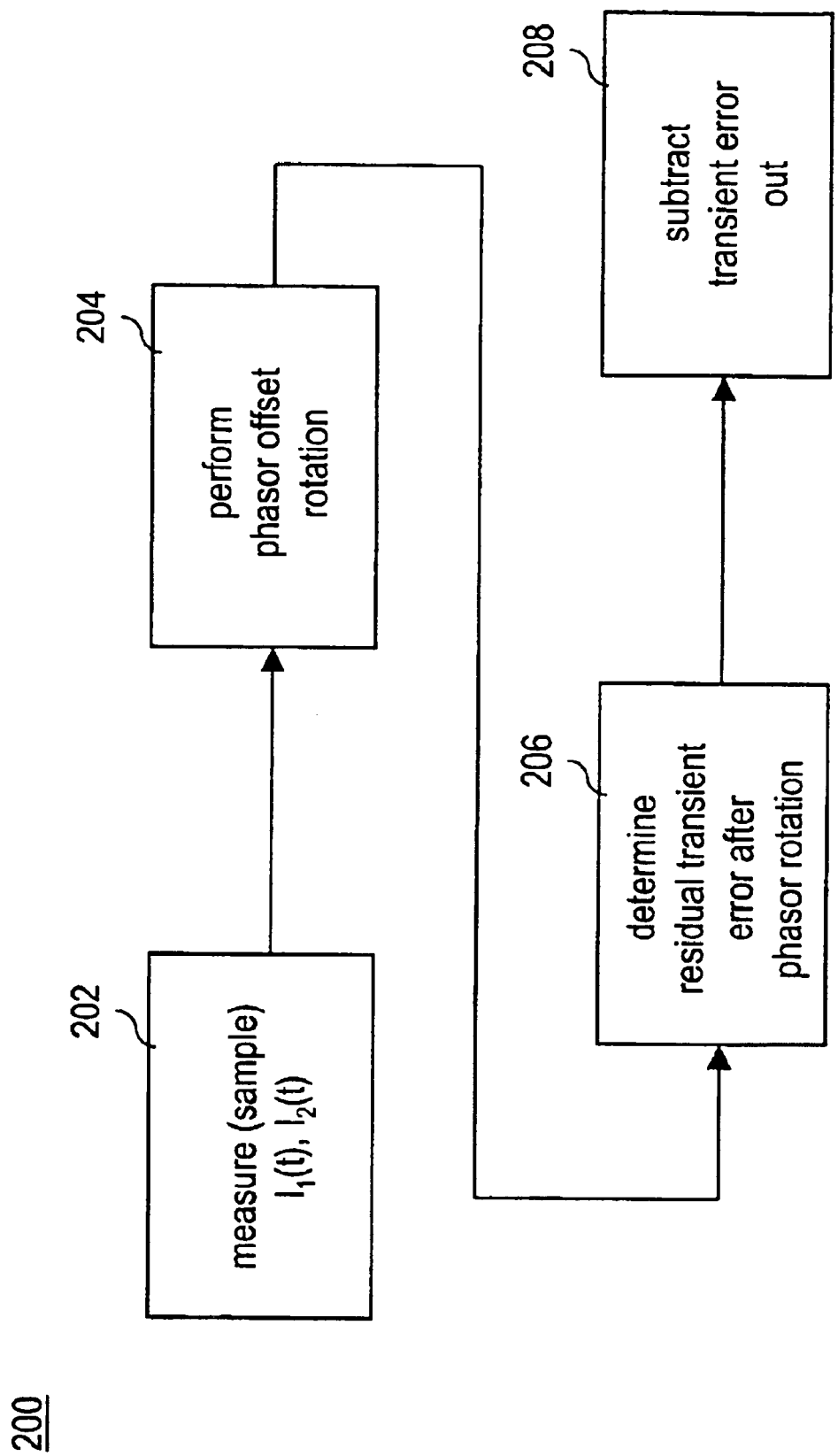
FIG. 2 is a block diagram illustrating a method for canceling transient errors in unsynchronized digital current differential transmission line protection systems, in accordance with an embodiment of the invention.

Given the above analysis, FIG. 2 is a block diagram illustrating a method 200 for canceling transient errors in unsynchronized digital current differential transmission line protection systems, in accordance with an embodiment of the invention. At block 202, the currents $I_1$, $I_2$ from each terminal (i.e., each end of a protected component) are obtained by a suitable measurement sample, such as over a one-cycle window. Then, at block 204, one of the current phasors is adjusted with respect to the other so as to account for a sampling clock offset. For example, given the measurability of the relative offset, then the second phasor is rotated to account for the offset. Once the phase rotation is complete, the residual transient error component is determined, as indicated at block 206 and described above. Finally, the residual error component E(t) is subtracted out as shown in block 208, thereby resulting in greater accuracy in unsynchronized protection schemes during transients.

As will be appreciated, the above described method can be embodied in the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for determining transient errors in an unsynchronized, digital current differential transmission line protection system, the method comprising:

receiving a first current phasor measurement at a time, t;

receiving a second current phasor measurement at said time t;

adjusting said second current phasor so as to account for a determined offset between a first sampling clock associated with said first current phasor measurement and a second sampling clock associated with said second current phasor measurement, thereby resulting in a rotated second current phasor measurement; and obtaining a residual transient error from said rotated second current phasor measurement and said first current phasor measurement.

2. The method of claim 1, wherein said residual transient error is obtained by subtracting said first current phasor measurement from said rotated second current phasor measurement.

3. The method of claim 2, wherein said residual transient error, E(t), is obtained in accordance with the expression:

$$E(t) = I_2'(t) - I_1(t)$$
$$= \frac{2}{T}\int_{-T+\Delta t}^{\Delta t} i(t+\tau) \cdot e^{-j\frac{2\pi\tau}{T}} \cdot d\tau - \frac{2}{T}\int_{-T}^{0} i(t+\tau) \cdot e^{-j\frac{2\pi\tau}{T}} \cdot d\tau$$

wherein $I_1(t)$ is said first current phasor measurement, $I_2'(t)$ is said rotated second current phasor measurement, T is a time period at a nominal power frequency of the transmission line system, and $\Delta t$ is said determined offset between said first sampling clock and said second sampling clock.

4. The method of claim 3, wherein said residual transient error, E(t), is simplified in accordance with the expression:

$$E(t) = \left[2\frac{\Delta t}{T}\right] \cdot [i(t) - i(t-T)].$$

5. The method of claim 3, wherein said adjusting said second current phasor is implemented in accordance with the expression:

$$I_2'(t) = e^{-j\Delta\phi} \cdot I_2(t) = \frac{2}{T}\int_{-T+\Delta t}^{\Delta t} i(t+\tau) \cdot e^{-j\frac{2\pi\tau}{T}} \cdot d\tau;$$

$$\text{with } \Delta\phi = \frac{2\pi \cdot \Delta t}{T};$$

wherein $I_2(t)$ is said second current phasor measurement, and $\Delta\phi$ is a relative clock shift, in radians, at said nominal power frequency.

6. A method for canceling transient errors in an unsynchronized, digital current differential transmission line protection system, the method comprising:

receiving a first current phasor measurement at a time, t;

receiving a second current phasor measurement at said time t;

adjusting said second current phasor so as to account for a determined offset between a first sampling clock associated with said first current phasor measurement and a second sampling clock associated with said second current phasor measurement, thereby resulting in a rotated second current phasor measurement;

obtaining a residual transient error from said rotated second current phasor measurement and said first current phasor measurement; and subtracting out said residual transient error from said first and said second current phasor measurements.

7. The method of claim 6, wherein said residual transient error is obtained by subtracting said first current phasor measurement from said rotated second current phasor measurement.

8. The method of claim 7, wherein said residual transient error, E(t), is obtained in accordance with the expression:

$$E(t) = I_2'(t) - I_1(t)$$
$$= \frac{2}{T}\int_{-T+\Delta t}^{\Delta t} i(t+\tau) \cdot e^{-j\frac{2\pi\tau}{T}} \cdot d\tau - \frac{2}{T}\int_{-T}^{0} i(t+\tau) \cdot e^{-j\frac{2\pi\tau}{T}} \cdot d\tau$$

wherein $I_1(t)$ is said first current phasor measurement, $I_2'(t)$ is said rotated second current phasor measurement, T is a time period at a nominal power frequency of the transmission line system, and $\Delta t$ is said determined offset between said first sampling clock and said second sampling clock.

9. The method of claim 8, wherein said residual transient error, E(t), is simplified in accordance with the expression:

$$E(t) = \left[2\frac{\Delta t}{T}\right] \cdot [i(t) - i(t-T)].$$

10. The method of claim 8, wherein said adjusting said second current phasor is implemented in accordance with the expression:

$$I_2'(t) = e^{-j\Delta\phi} \cdot I_2(t) = \frac{2}{T}\int_{-T+\Delta t}^{\Delta t} i(t+\tau) \cdot e^{-j\frac{2\pi\tau}{T}} \cdot d\tau;$$

$$\text{with } \Delta\phi = \frac{2\pi \cdot \Delta t}{T};$$

wherein $I_2(t)$ is said second current phasor measurement, and $\Delta\phi$ is a relative clock shift, in radians, at said nominal power frequency.

11. A storage medium, comprising:

a machine readable computer program code for determining transient errors in an unsynchronized, digital current differential transmission line protection system; and instructions for causing a computer to implement a method, the method further comprising:

receiving a second current phasor measurement at said time t;

adjusting said second current phasor so as to account for a determined offset between a first sampling clock associated with said first current phasor measurement and a second sampling clock associated with said second current phasor measurement, thereby resulting in a rotated second current phasor measurement; and obtaining a residual transient error from said rotated second current phasor measurement and said first current phasor measurement.

* * * * *

UNITED STATES PATENT AND TRADEMARK OFFICE
CERTIFICATE OF CORRECTION

PATENT NO. : 6,915,219 B2
DATED : July 5, 2005
INVENTOR(S) : William J. Premerlani It is certified that error appears in the above-identified patent and that said Letters Patent is hereby corrected as shown below:

Column 2,
Line 35, after "with" delete "and" and insert therefor -- an --.
Line 62, after "devices" insert therefor -- 108, --.

Column 4,
Line 2, before "and" delete "systems" and insert therefor -- system --.
Line 51, after "would" insert therefor -- be --.

Column 7,
Line 32, after "wherein" delete "said".

Signed and Sealed this

Twentieth Day of September, 2005

JON W. DUDAS
*Director of the United States Patent and Trademark Office*